(12) United States Patent
Inazumachi et al.

(10) Patent No.: US 8,264,813 B2
(45) Date of Patent: Sep. 11, 2012

(54) ELECTROSTATIC CHUCK DEVICE

(75) Inventors: Hiroshi Inazumachi, Funabashi (JP);
Mamoru Kosakai, Chiyoda-ku (JP);
Yukio Miura, Chiyoda-ku (JP); Keigo Maki, Chiyoda-ku (JP)

(73) Assignee: Sumitomo Osaka Cement Co., Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 12/310,094

(22) PCT Filed: Aug. 1, 2007

(86) PCT No.: PCT/JP2007/065073
§ 371 (c)(1),
(2), (4) Date: Feb. 9, 2009

(87) PCT Pub. No.: WO2008/018341
PCT Pub. Date: Feb. 14, 2008

(65) Prior Publication Data
US 2010/0002354 A1 Jan. 7, 2010

(30) Foreign Application Priority Data
Aug. 10, 2006 (JP) .................. 2006-218449

(51) Int. Cl.
*H02H 1/00* (2006.01)
(52) U.S. Cl. .................... 361/234; 279/128
(58) Field of Classification Search .......... 361/230–234; 279/128
See application file for complete search history.

(56) References Cited

U.S. PATENT DOCUMENTS

| | | | | |
|---|---|---|---|---|
| 5,953,200 A | * | 9/1999 | Haley et al. | 361/234 |
| 6,351,367 B1 | * | 2/2002 | Mogi et al. | 361/234 |
| 6,693,789 B2 | * | 2/2004 | Inazumachi et al. | 361/234 |
| 2004/0148153 A1 | | 7/2004 | Beletsky et al. | |
| 2005/0276928 A1 | | 12/2005 | Okumura et al. | |

FOREIGN PATENT DOCUMENTS

| | | |
|---|---|---|
| JP | 2000-100919 | 4/2000 |
| JP | 2001-287982 | 10/2001 |
| JP | 2004-6505 | 1/2004 |
| JP | 2004-79588 | 4/2004 |
| JP | 2004-363552 | 12/2004 |

* cited by examiner

*Primary Examiner* — Jared Fureman
*Assistant Examiner* — Terrence R Willoughby
(74) *Attorney, Agent, or Firm* — Merchant & Gould P.C.

(57) ABSTRACT

An electrostatic chuck device which enables to perform a plasma process having high in-plane uniformity to a plane-like sample by improving the in-plane uniformity of the electric field intensity in a plasma when applied to a plasma processing apparatus. Specifically disclosed is an electrostatic chuck device (21) including an electrostatic chuck section (22), a metal base section (23) serving as a high-frequency generating electrode, and an insulating plate (24). The electrostatic chuck section (22) is composed of a dielectric plate (31) whose top surface (31a) serves as a mounting surface on which a plate-like sample (W) is placed, a supporting plate (32), an electrostatic-adsorption inner electrode (25), and an insulating layer (33). The electrostatic-adsorption inner electrode (25) is made of a composite sintered body containing an insulating ceramic and silicon carbide, while having a volumetric resistance of not less than $1.0 \times 10^{-1}$ Ωcm but not more than $1.0 \times 10^{8}$ Ωcm.

11 Claims, 6 Drawing Sheets

PRIOR ART

PRIOR ART

PRIOR ART

ELECTROSTATIC CHUCK DEVICE

This application is a National Stage Application of PCT/JP2007/065073, filed 1 Aug. 2007, which claims benefit of Serial No. 2006-218449, filed 10 Aug. 2006 in Japan and which application(s) are incorporated herein by reference. To the extent appropriate, a claim of priority is made to each of the above disclosed applications.

BACKGROUND OF THE INVENTION

1. Field of the Invention

The present invention relates to an electrostatic chuck device, and more particularly, to an electrostatic chuck device suitable for use in a high-frequency discharge type plasma processing apparatus for applying a high-frequency voltage to an electrode to generate plasma and processing a plate-like sample such as a semiconductor wafer, a metal wafer, and a glass plate by the use of the generated plasma.

2. Description of the Related Art

Conventionally, plasma was often used in processes such as etching, deposition, oxidation, and sputtering for manufacturing semiconductor devices such as IC, LSI, and VLSI or flat panel displays (FPD) such as a liquid crystal display, in order to allow a process gas to react sufficiently at a relatively low temperature. In general, methods of generating plasma in plasma processing apparatuses are roughly classified into a method using glow discharge or high-frequency discharge and a method using microwaves.

FIG. 7 is a sectional view illustrating an example of an electrostatic chuck device 1 mounted on a known high-frequency discharge type plasma processing apparatus. The electrostatic chuck device 1 is disposed in a lower portion of a chamber (not shown) also serving as a vacuum vessel and includes an electrostatic chuck section 2 and a metal base section 3 fixed to the bottom surface of the electrostatic chuck section 2 so as to be incorporated into a body.

The electrostatic chuck section 2 includes: a substrate 4, which has a top surface serving as a mounting surface 4a, on which a plate-like sample W such as a semiconductor wafer is disposed, so as to adsorb the plate-like sample W in an electrostatic manner, and an electrostatic-adsorption inner electrode 5 built therein; and a power supply terminal 6 for applying a DC voltage to the electrostatic-adsorption inner electrode 5. A high DC voltage source 7 is connected to the power supply terminal 6. The metal base section 3, which is also used as a high-frequency generating electrode (lower electrode), is connected to a high-frequency voltage generating source 8 and has a flow passage 9 for circulating a cooling medium such as water or an organic solvent formed therein. The chamber is grounded.

The electrostatic chuck device 1 adsorbs the plate-like sample W, by placing the plate-like sample W on the mounting surface 4a and allowing the high DC voltage source 7 to apply a DC voltage to the electrostatic-adsorption inner electrode 5 through the power supply terminal 6. Subsequently, a vacuum is generated in the chamber and a process gas is introduced thereto. Then, by allowing the high-frequency voltage generating source 8 to apply high-frequency power across the metal base section 3 (lower electrode) and an upper electrode (not shown), a high-frequency electric field is generated in the chamber. Frequencies of several tens of MHz or less are generally used as the high frequency.

The high-frequency electric field accelerates electrons, plasma is generated due to ionization by collision of the electrons with the process gas, and a variety of processes can be performed by the use of the generated plasma.

In the recent plasma processes, there is an increased need for processes using "low-energy and high-density plasma" having low ion energy and high electron density. In the processes using the low-energy and high-density plasma, the frequency of the high-frequency power for generating plasma might increase greatly, for example, to 100 MHz.

In this way, when the frequency of the power to be applied increases, the electric field strength tends to increase in a region corresponding to the center of the electrostatic chuck section 2, that is, the center of the plate-like sample W, and to decrease in the peripheral region thereof. Accordingly, when the distribution of the electric field strength is not even, the electron density of the generated plasma is not even and thus the processing rate varies depending on in-plane positions in the plate-like sample W. Therefore, there is a problem in that it is not possible to obtain a processing result excellent in in-plane uniformity.

A plasma processing apparatus shown in FIG. 8 has been suggested to solve such a problem (see Patent Document 1).

In the plasma processing apparatus 11, in order to improve the in-plane uniformity of the plasma process, a dielectric layer 14 made of ceramics or the like is buried at the central portion on the surface of the lower electrode (metal base section) 12 supplied with the high-frequency power and opposed to the upper electrode 13, thereby making the distribution of the electric field strength even. In the figure, reference numeral 15 denotes a high frequency generating power source, PZ denotes plasma, E denotes electric field strength, and W denotes the plate-like sample.

In the plasma processing apparatus 11, when the high frequency generating power source 15 applies the high-frequency power to the lower electrode 12, high-frequency current having been transmitted on the surface of the lower electrode 12 and having reached the top due to a skin effect flows toward the center along the surface of the plate-like sample W, and a part thereof leaks toward the lower electrode 12 and then flows outward inside the lower electrode 12. In this course, the high-frequency current is submerged deeper in the region provided with the dielectric layer 14 than the region not provided with the dielectric layer 14, thereby generating hollow cylindrical resonance of a TM mode. As a result, the electric field strength of the central portion supplied to the plasma from the surface of the plate-like sample W is weakened and thus the in-plane electric field of the plate-like sample W is made to be uniform.

The plasma process is often performed under depressurized conditions close to a vacuum. In this case, an electrostatic chuck device shown in FIG. 9 is often used to fix the plate-like sample W.

The electrostatic chuck device 16 has a structure such that a conductive electrostatic-adsorption inner electrode 18 is built in a dielectric layer 17. For example, the conductive electrostatic inner electrode is interposed between two dielectric layers formed by thermally spraying alumina or the like.

The electrostatic chuck device 16 adsorbs and fixes the plate-like sample W by the use of the electrostatic adsorption force generated on the surface of the dielectric layer 17 by allowing the high DC voltage source 7 to apply the high DC power to the electrostatic-adsorption inner electrode 18.

[Patent Document 1] Japanese Patent Unexamined Publication No. 2004-363552 (see paragraphs 0084 and 0085 of page 15 and FIG. 19)

However, even in such an electrostatic chuck device, because the potential of the plasma above the center portion of the plate-like sample W becomes high and the potential at the peripheral portion thereof becomes low, the processing rate differs at the center portion and the peripheral portion of the plate-like sample W, and there is a problem in that this is a factor causing in-plane unevenness in a plasma process such as etching. In addition, the action and responsiveness of the electrostatic adsorption force were also inadequate.

Thus, as a result of intensive investigations to solve the shortcomings described above, the inventors found that the volumetric resistance of the electrostatic-adsorption inner electrode of the electrostatic clutch device must be set within a range of $1.0 \times 10^{-1}$ Ωcm to $1.0 \times 10^5$ Ωcm, and preferably, from $1.0 \times 10^2$ Ωcm to $1.0 \times 10^4$ Ωcm.

In addition, the following types of sintered bodies may be provided as examples of materials that have such a volumetric resistance:

(1) a sintered body in which a high melting point metal such as molybdenum (Mo), tungsten (W), and tantalum (Ta) is added to insulating ceramics such as alumina ($Al_2O_3$);

(2) a sintered body in which conductive ceramics such as tantalum nitride (TaN), tantalum carbide (TaC), and molybdenum carbide ($Mo_2C$) are added to an insulating ceramic such as alumina ($Al_2O_3$); and (3) a sintered body in which a conductor such as carbon (C) is added to an insulating ceramic such as alumina ($Al_2O_3$).

However, when fabricating the electrostatic-adsorption inner electrode by using the sintered bodies in (1) to (3) described above, it is difficult to evenly mix conducting components such as high melting temperature metals, conducting ceramics, and carbon, with insulating ceramics on an industrial scale. Thus, the proportions of these conducting components easily deviate from the proportions that are necessary for obtaining the target volumetric resistance value. Accordingly, when these conducting components vary even slightly, the volumetric resistance value varies significantly. Thus, this volumetric resistance does not attain a desired constant value, and therefore there is a problem in that the volumetric resistance easily deviates from a range of $1.0 \times 10^{-1}$ Ωcm to $1.0 \times 10^5$ Ωcm, and preferably, from $1.0 \times 10^2$ Ωcm to $1.0 \times 10^4$ Ωcm, and preparing the volumetric resistance of the electrostatic-adsorption inner electrode so as to attain the desired constant value is extremely difficult.

In addition, in an industrial scale heat treatment furnace that is used when fabricating an electrostatic chuck device, the temperature distribution inside the furnace is not even, and normally there is a variation in the temperature of about ±25° C. to ±50° C. Thus, when fabricating this electrostatic chuck device, a conductive material layer, which forms the electrostatic-adsorption inner electrode and includes the raw components of the above-described sintered bodies (1) to (3), is interposed between a mounting plate on which the plate-like sample is mounted and a supporting plate that supports this mounting plate. Subsequently, when these are baked and the mounting plate, electrostatic-adsorption inner electrode, and the supporting plate are integrated by bonding to form an integrated body, the volumetric resistance of the electrostatic-adsorption inner electrode that has been produced is significantly influenced by the temperature distribution in the furnace. Thus, this volumetric resistance does not attain the desired constant value, and therefore there is a problem in that the volumetric resistance easily deviates from the range of $1.0 \times 10^{-1}$ Ωcm to $1.0 \times 10^5$ Ωcm, and preferably, from $1.0 \times 10^2$ Ωcm to $1.0 \times 10^4$ Ωcm, and preparing the volumetric resistance of the electrostatic-adsorption inner electrode so as to attain a desired constant value becomes extremely difficult.

Accordingly, the volumetric resistance of the electrostatic-absorption inner electrode is easily influenced by the variations in the conductive component and variations in the temperature during baking, and thus stably obtaining the desired constant value is difficult. Consequently, it is difficult to realize a uniform plasma process on the plate-like sample and to obtain an electrostatic chuck device in which the action and responsiveness of the electrostatic adsorption force are advantageous.

In consideration of the circumstances described above, it is an object of the invention to provide an electrostatic chuck device in which, when applied to a plasma process apparatus, the in-plane uniformity of the electric field strength in the plasma is improved, and a plasma process having a high in-plane uniformity with respect to the plate-like sample can be carried out.

SUMMARY OF THE INVENTION

As a result of intensive research intended to solve the shortcomings described above, the inventors found that when the electrostatic-adsorption inner electrode is made a complex sintered body that contains insulating ceramics and silicon carbide, which is a conducting component, and the volumetric resistance of the electrostatic-adsorption inner electrode of the electrostatic clutch was set within a range of $1.0 \times 10^{-1}$ Ωcm to $1.0 \times 10^5$ Ωcm, the problems that have been described above could be efficiently solved, and the present invention was brought to completion.

Specifically, the electrostatic chuck device of the present invention is provided with an electrostatic chuck section that is provided with a substrate, which has one main surface serving as a mounting surface on which a plate-like sample is mounted and an electrostatic-adsorption inner electrode built therein, and a power supply terminal that applies a direct current voltage to this electrostatic-adsorption inner electrode; and a metal base section that is fixed to the other main surface of the substrate of this electrostatic chuck section so as to be integrated therewith and serves as a high frequency generating electrode. The electrostatic-adsorption inner electrode is made of a complex sintered body that includes an insulating ceramic and silicon carbide, and the volumetric resistance thereof is in the range of $1.0 \times 10^{-1}$ Ωcm to $1.0 \times 10^5$ Ωcm.

In this electrostatic chuck device, because the electrostatic-adsorption inner electrode is made of a complex sintered body that contains insulating ceramics and silicon carbide, and the volumetric resistance thereof is set from $1.0 \times 10^{-1}$ Ωcm to $1.0 \times 10^5$ Ωcm, even if the content of the silicon carbide (SiC), which is a conducting component, deviates from the content that is necessary for obtaining a target volumetric resistance, the volumetric resistance of this electrostatic-adsorption inner electrode does not deviate significantly from the target value. In addition, the variation in this volumetric resistance due to temperature is also small, and the electrostatic chuck device can be used stably in a temperature range from room temperature (25° C.) to 100° C.

In addition, even in the case in which the thermal processing temperature and the baking temperature vary when fabricating this electrostatic-adsorption inner electrode, the volumetric resistance of this electrostatic-adsorption inner electrode does not deviate significantly from the target value.

Thereby, the volumetric resistance of the electrostatic-adsorption inner electrode is maintained within a range of $1.0 \times 10^{-1}$ Ωcm to $1.0 \times 10^5$ Ωcm. When a high frequency voltage is applied to the metal base, the high frequency current passes through the electrostatic-adsorption inner electrode and the uniformity of the plasma density is efficiently attained. Thus, a uniform plasma process can be carried out on the plate-like sample. In addition, the action and the responsiveness of the electrostatic adsorption force is superior.

This complex sintered body preferably contains silicon carbide in a range of 5 wt % to 20 wt %.

In this sintered body, because the content of the silicon carbide in the complex sintered body is controlled so as to be in a range of 5 wt % to 20 wt %, the volumetric resistance of the electrostatic-adsorption inner electrode can be easily set within a range of $1.0 \times 10^{-1}$ Ωcm to $1.0 \times 10^{5}$ Ωcm.

In addition, because the complex sintered body contains silicon carbide, a superior density and mechanical strength can be imparted thereto.

This complex sintered body preferably contains one or more species selected from a group consisting of metals, carbon, and conducting ceramics equal to or less than a total of 30 vol %.

Because this complex sintered body contains one or more species selected from a group consisting of metals, carbon, and conducting ceramics equal to or less than a total of 30 vol %, the volumetric resistance of the complex sintered body can be easily prepared within a range of $1.0 \times 10^{-1}$ Ωcm to $1.0 \times 10^{5}$ Ωcm.

EFFECTS OF THE INVENTION

According to the electrostatic chuck device of the present invention, because the electrostatic-adsorption inner electrode is formed by a complex sintered body that contains insulating ceramics and silicon carbide and the volumetric resistance thereof is set within a range of $1.0 \times 10^{-1}$ Ωcm to $1.0 \times 10^{5}$ Ωcm, even if the content of the silicon carbide (SiC), which is the conducting component, deviates from the content that is necessary for obtaining the target volumetric resistance, and in addition, even if the heat treatment temperature and the baking temperature vary when fabricating this electrostatic-adsorption inner electrode, the volumetric resistance of this electrostatic-adsorption inner electrode can be advantageously maintained within a range of $1.0 \times 10^{-1}$ Ωcm to $1.0 \times 10^{5}$ Ωcm. Therefore, when high frequency voltage is applied to the metal base, a high frequency current can pass through the electrostatic-adsorption inner electrode, and a uniform plasma density can be effectively attained.

Thus, a uniform plasma process can be applied to the plate-like sample. In addition, an electrostatic adsorption force having superior action and responsiveness can be attained.

In addition, because the complex sintered body contains silicon carbide in a range of 5 wt % to 20 wt %, the volumetric resistance of the electrostatic-adsorption inner electrode can be easily controlled so as to be within a range of $1.0 \times 10^{-1}$ Ωcm to $1.0 \times 10^{5}$ Ωcm.

In addition, because the complex sintered body contains silicon carbide, a superior density and mechanical strength can be imparted thereto.

In addition, because the complex sintered body contains one or more species selected from a group consisting of metals, carbon, and conducting ceramics equal to or less than a total of 30 vol %, the volumetric resistance can be easily prepared so as to be within a range of $1.0 \times 10^{-1}$ Ωcm to $1.0 \times 10^{5}$ Ωcm.

DETAILED DESCRIPTION OF THE INVENTION

The preferred embodiments for implementing the electrostatic chuck device of the present invention will be explained.

Note that each of the following embodiments provides specific explanations for better understanding the gist of the invention, and unless otherwise indicated, these embodiments do not limit the present invention.

Figure 1:
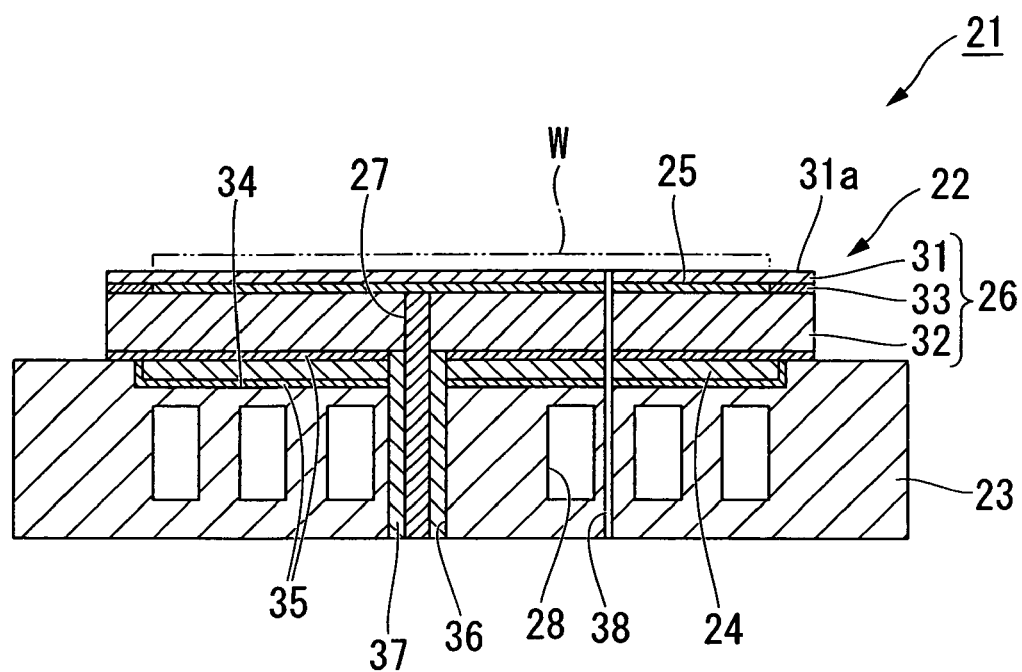
FIG. 1 is a sectional view illustrating an electrostatic chuck device according to a first embodiment of the invention.

FIG. 1 is a cross-sectional view illustrating an electrostatic chuck device 21 according to a first embodiment of the invention. The electrostatic chuck device 21 includes an electrostatic chuck section 22, a metal base section 23, and a dielectric plate 24.

The electrostatic chuck section 22 includes a disc-like substrate 26, the top surface (one main surface) of which serves as a mounting surface for mounting a plate-like sample W and in which an electrostatic-adsorption inner electrode 25 is built, and a power supply terminal 27 for applying a DC voltage to the electrostatic-adsorption inner electrode 25.

The substrate 26 roughly includes a disc-like mounting plate 31 of which the top surface 31a serves as the mounting surface for mounting the plate-like sample W such as a semiconductor wafer, a metal wafer, and a glass plate, a disc-like support plate 32 disposed opposite the bottom surface (the other main surface) of the mounting plate 31, the planar electrostatic-adsorption inner electrode 25 interposed between the mounting plate 31 and the support plate 32, and a ring-shaped insulating layer 33 disposed to surround the inner electrode 25.

At the same time, a structure is used in which a flow path 28 that circulates a cooling medium such as water or an organic solvent therein is formed in the metal base 23, and the temperature of the plate-like sample W, which is mounted on the mounting surface described above, can be maintained at a desired temperature. This metal base 23 also serves as a high-frequency generating electrode.

A circular concave portion 34 is formed in the surface (main surface) of the metal base section 23 facing the electrostatic chuck section 22 and the dielectric plate 24 is adhesively bonded to the concave portion 34 with an insulating adhesive bonding layer 35 or a conductive adhesive bonding layer interposed therebetween. The dielectric plate 24 and the support plate 32 of the electrostatic chuck section 22 are adhesively bonded to each other with the insulating adhesive bonding layer 35 interposed therebetween.

A power supply terminal insertion hole 36 is formed in the vicinity of the center of the support plate 32 and the metal base section 23, and the power supply terminal 27 for applying a DC voltage to the electrostatic-adsorption inner electrode 25 is inserted into the power supply terminal insertion hole 36 with a cylindrical insulator 37 interposed therebetween. The top end of the power supply terminal 27 is electrically connected to the electrostatic-adsorption inner electrode 25.

A cooling gas introduction hole 38 penetrating the mounting plate 31, the support plate 32, the electrostatic-adsorption inner electrode 25, and the metal base section 23 is formed therein and thus a cooling gas such as He is supplied to a gap between the mounting plate 31 and the bottom surface of the plate-like sample W through the cooling gas introduction hole 38.

A top surface 31a of the mounting plate 31 serves as an electrostatic adsorption surface which is mounted with a sheet of the plate-like sample W so as to electrostatically adsorb the plate-like sample W by means of an electrostatic adsorption force. The top surface (electrostatic adsorption surface) 31a is provided with a plurality of cylindrical protrusions (not shown) having a substantially circular section along the top surface 31a and the top surfaces of the protrusions are parallel to the top surface 31a.

A wall portion (not shown) that continuously extends along the peripheral portion and that has the same height as the protrusions so as not to leak the cooling gas such as He is formed in the peripheral portion of the top surface 31a so as to surround the peripheral portion of the top surface 31a circularly.

The insulating adhesive bonding layer 35, which adhesively bonds this dielectric plate 24 and the supporting plate 32 of the electrostatic chuck section 22 to each other, is not limited in particular provided that the insulating property thereof is superior, and for example, one in which aluminum nitrate (AlN) powder or alumina ($Al_2O_3$) powder, which are insulating ceramics, is added to a silicon-based adhesive can be advantageously used.

Here, the reason for using the insulating adhesive bonding layer 35 is as follows. When the dielectric plate 24 and the supporting plate 32 are adhesively bonded to each other with a conducting adhesive bonding layer interposed therebetween instead of this insulating adhesive bonding layers 35, the high-frequency current cannot pass through the conducting adhesive bonding layer, but flows toward the peripheral edge portion through this conducting adhesive bonding layer, and uniform plasma cannot be realized.

Here, a structure has been used in which the dielectric plate 24 and the concave portion 34 are bonded and fixed with the insulating adhesive bonding layer 35 interposed therebetween. However, the method of fixing the dielectric plate 24 and the concave portion 34 is not limited in particular. For example, a structure may be used in which they are bonded and fixed with a conducting adhesive bonding layer interposed therebetween, or a structure may be used in which the adhesive bonding portions of the dielectric plate 24 and the concave portion 34 are given complementary shapes, and the dielectric plate 24 and the concave portion 34 are fit together.

The electrostatic chuck device 21 having the above-mentioned configuration is placed in a chamber of a plasma processing apparatus such as a plasma etching apparatus, the plate-like sample W is mounted on the top surface 31a of the mounting surface, and then a variety of plasma processes can be performed on the plate like sample W by applying a high-frequency voltage across the metal base section 23 also serving as a high frequency generating electrode and the upper electrode to generate plasma on the mounting plate 31 while applying a predetermined DC voltage to the electrostatic-adsorption inner electrode 25 through the power supply terminal 27 to adsorb and fix the plate-like sample W by the use of an electrostatic force.

Next, the elements of the electrostatic chuck device will be described in more detail.

"Mounting Plate and Support Plate"

The mounting plate 31 and the support plate 32 are both made of ceramics.

Ceramics including one kind selected from or complex ceramics including two or more kinds selected from aluminum nitride (AlN), aluminum oxide ($Al_2O_3$), silicon nitride ($Si_3N_4$), zirconium oxide ($ZrO_2$), sialon, boron nitride (BN), and silicon carbide (SiC) can be preferably used as the ceramics.

The materials may be used alone or in combination. It is preferable that the thermal expansion coefficient thereof be as close as possible to that of the electrostatic-adsorption inner electrode 25 and that they can be easily sintered. Since the top surface 31a of the mounting plate 31 serves as an electrostatic adsorption surface, it is preferable that a material having a high dielectric constant and not providing impurities to the plate-like sample W be selected.

In consideration of the above description, the mounting plate 31 and the support plate 32 are made of a silicon carbide-aluminum oxide complex sintered body in which silicon carbide is contained substantially in the range of 1 wt % to 20 wt % and the balance is aluminum oxide.

When a complex sintered body including aluminum oxide ($Al_2O_3$) and silicon carbide (SiC) of which the surface is coated with silicon oxide ($SiO_2$) is used as the silicon carbide-aluminum oxide complex sintered body and the content of silicon carbide (SiC) is set to the range of 5 wt % to 15 wt % with respect to the entire complex sintered body, the volumetric resistance at room temperature (25° C.) is $1.0 \times 10^{14}$ Ωcm or more, and thus the complex sintered body is suitable for the mounting plate 31 of a coulomb type electrostatic chuck device. The complex sintered body is excellent in wear resistance, does not cause contamination of a wafer or generation of particles, and has enhanced plasma resistance.

When a complex sintered body including aluminum oxide ($Al_2O_3$) and silicon carbide (SiC) is used as the silicon carbide-aluminum oxide complex sintered body and the content of silicon carbide (SiC) is set to the range of 5 wt % to 15 wt % with respect to the entire complex sintered body, the volumetric resistance thereof at room temperature (25° C.) is in the range of $1.0 \times 10^9$ Ωcm to $1.0 \times 10^{12}$ Ωcm, and thus the complex sintered body is suitable for the mounting plate 31 of a Johnson-Rahbeck type electrostatic chuck device. The complex sintered body is excellent in wear resistance, does not cause contamination of a wafer or generation of particles, and has enhanced plasma resistance.

The average particle diameter of silicon carbide particles in the silicon carbide-aluminum oxide complex sintered body is preferably 0.2 μm or less.

When the average particle diameter of the silicon carbide particles is greater than 0.2 μm, the electric field at the time of application of the plasma is concentrated on portions of the silicon carbide particles in the silicon carbide-aluminum oxide complex sintered body, thereby easily damaging the peripheries of the silicon carbide particles.

The average particle diameter of the aluminum oxide particles in the silicon carbide-aluminum oxide complex sintered body is preferably 2 μm or less.

When the average particle diameter of the aluminum oxide particles is greater than 2 μm, the silicon carbide-aluminum oxide complex sintered body is easily etched by the plasma to form sputtering scars, thereby increasing the surface roughness.

"Electrostatic-Adsorption Inner Electrode"

The electrostatic-adsorption inner electrode 25 is formed of a disk-shaped complex sintered body consisting of an insulating ceramic and silicon carbide, having a thickness in the range of about 10 μm to 50 μm and the volumetric resistance at the usage temperature of the electrostatic chuck device is preferably in the range of $1.0 \times 10^{-1}$ Ωcm to $1.0 \times 10^5$ Ωcm and more preferably in the range of $1.0 \times 10^2$ Ωcm to $1.0 \times 10^4$ Ωcm.

Here, the reason for limiting the volumetric resistance to the above-mentioned range is as follows. When the volumetric resistance is less than $1.0 \times 10^{-1}$ Ωcm and a high-frequency voltage is applied to the metal base section 23, the high-frequency current does not pass through the electrostatic-adsorption inner electrode 25 and the electric field strength on the surface of the electrostatic chuck section 22 is not even, thereby not obtaining a uniform plasma. On the other hand, when the volumetric resistance is greater than $1.0 \times 10^5$ Ωcm, the electrostatic-adsorption inner electrode 25 substantially becomes an insulator and thus does not function as an electrostatic-adsorption inner electrode so as not to generate an electrostatic adsorption force, or the responsiveness of the electrostatic adsorption force is deteriorated and thus a long time is required for generating the necessary electrostatic adsorption force.

As a complex sintered body that contains this insulating ceramic and silicon carbide, a silicon carbide-aluminum oxide complex sintered body that uses aluminum oxide as an insulating ceramic is preferable because it is possible to easily obtain a target volumetric resistance within a range of $1.0 \times 10^{-1}$ Ωcm to $1.0 \times 10^5$ Ωcm by controlling the particle diameter of the aluminum oxide and the silicon carbide, and the baking conditions (the baking temperature, the baking time, the pressurization during baking and the like).

The particle diameter of the aluminum oxide ($Al_2O_3$) in the silicon carbide-aluminum oxide complex sintered body that forms this electrostatic-adsorption inner electrode 25 is preferably equal to or less than 5 μm, and more preferably, from 0.1 μm to 1 μm.

When the particle diameter of the aluminum oxide ($Al_2O_3$) exceeds 5 μm, the volumetric resistance becomes too large, and controlling the volumetric resistance of the silicon carbide-aluminum oxide complex sintered body so as to be from $1.0 \times 10^{-1}$ Ωcm to $1.0 \times 10^5$ Ωcm becomes difficult.

Here, in order to control the particle diameter of the aluminum oxide ($Al_2O_3$) so as to be equal to or less than 5 μm, the particle size of the aluminum oxide that is used and the baking conditions (the baking temperature, the baking time, the baking pressurization and the like) may be controlled.

In addition, it is not necessary for the entire area of this electrostatic-adsorption inner electrode 25 to be formed by a maternal that has a volumetric resistance within the range of $1.0 \times 10^{-1}$ Ωcm to $1.0 \times 10^5$ Ωcm. An area from 50%, and preferably from 70% of the total area of this electrostatic-adsorption inner electrode 25 may be formed by a material that has a volumetric resistance within the range of $1.0 \times 10^{-1}$ Ωcm to $1.0 \times 10^5$ Ωcm.

The shape and the size of this electrostatic-adsorption inner electrode 25 can be appropriately modified according to the object. In addition to the disc shape described above, examples of other shapes include those illustrated in FIG. 2 to FIG. 5.

Figure 2:
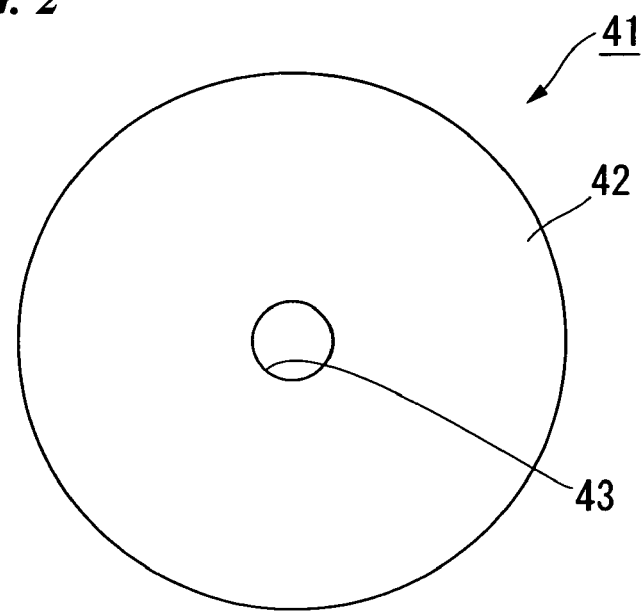
FIG. 2 is a plan view that illustrates a modified example of the electrostatic-adsorption inner electrode of the electrostatic chuck device of the first embodiment of the present invention.

FIG. 2 is a plan view that illustrates a modified example of the electrostatic-adsorption inner electrode of the electrostatic chuck device of the present embodiment. This is an example of an electrostatic-adsorption inner electrode for an electrostatic chuck device that is provided with a unipolar-type electrode-type electrostatic chuck section.

This electrostatic-adsorption inner electrode 41 is structured such that a circular opening 43 is formed at the center portion of a circular complex sintered body 42 that contains insulating ceramics and silicon carbide.

Figure 3:
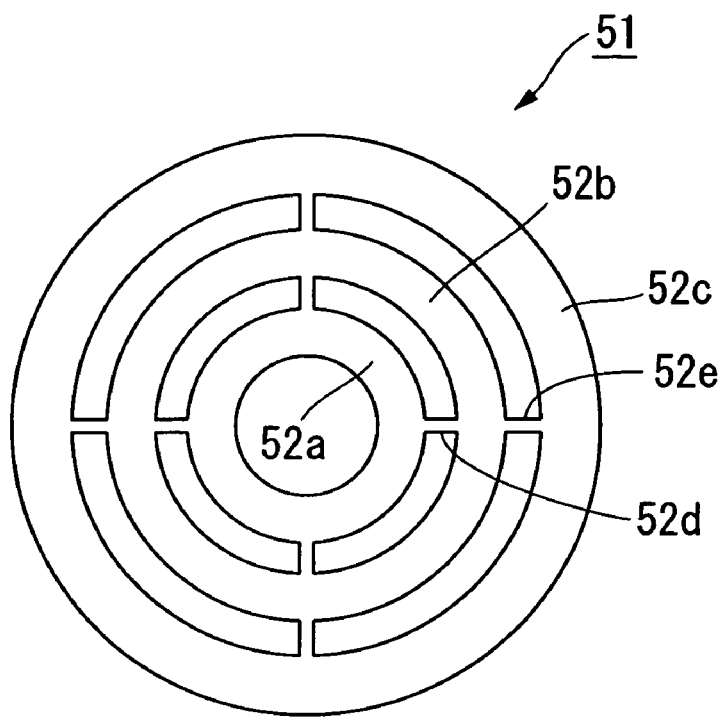
FIG. 3 is a plan view that illustrates a modified example of the electrostatic-adsorption inner electrode of the electrostatic chuck device of the first embodiment of the present invention.

FIG. 3 is a plan view that illustrates a modified example of the electrostatic-adsorption inner electrode of the electrostatic chuck device of the present embodiment. This is an alternative example of an electrostatic-adsorption inner electrode for an electrostatic chuck device that is provided with a unipolar-type electrostatic chuck section.

This electrostatic-adsorption inner electrode 51 is structured such that the complex sintered bodies 52a to 52c that contain insulating ceramics and silicon carbide and have different diameters are disposed concentrically, the complex sintered bodies 52a and 52b are connected by a plurality of stripe-shaped complex sintered bodies 52d (four in FIG. 3), and the complex sintered bodies 52b and 52c are connected by a plurality of stripe-shaped complex sintered bodies 52e (four in FIG. 3).

Figure 4:
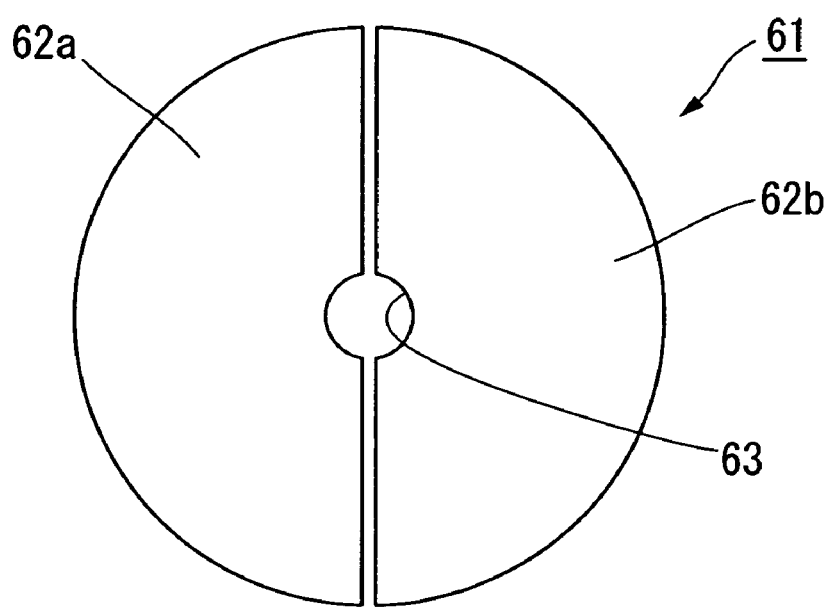
FIG. 4 is a plan view that illustrates a modified example of the electrostatic-adsorption inner electrode of the electrostatic chuck device of the first embodiment of the present invention.

FIG. 4 is a plan view that illustrates a modified example of an electrostatic-adsorption inner electrode for the electrostatic chuck device of the present embodiment. This is an example of an electrostatic-adsorption inner electrode for an electrostatic chuck device that is provided with a bipolar-type electrostatic chuck section.

This electrostatic-adsorption inner electrode 61 is structured such that semicircular complex sintered bodies 62a and 62b that contain insulating ceramics and silicon carbide are opposed so as to form an overall circular shape, and a circular opening 63 is formed at the center portion thereof.

Figure 5:
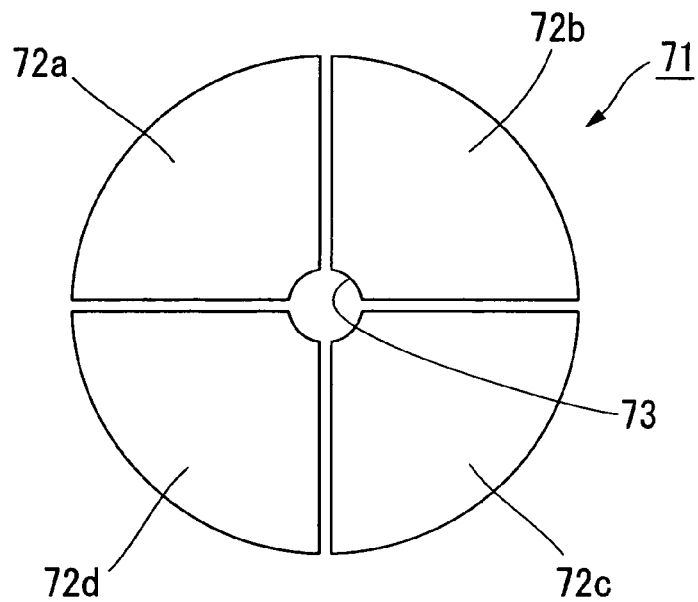
FIG. 5 is a plan view that illustrates a modified example of the electrostatic-adsorption inner electrode of the electrostatic chuck device of the first embodiment of the present invention.

FIG. 5 is a plan view that illustrates a modified example of an electrostatic-adsorption inner electrode for the electrostatic chuck device of the present embodiment. This is an alternative example of an electrostatic-adsorption inner electrode for an electrostatic chuck device that is provided with a bipolar-type electrostatic chuck section.

This electrostatic-adsorption inner electrode 71 is structured such that the fan-shaped complex sintered bodies 72a to 72d that contain insulating ceramics and silicon carbide are disposed so that the overall shape forms a circular shape that is centered on a center axis, and a circular opening 73 is formed in the central portion thereof.

"Insulating Layer"

The insulating layer 33 serves to bond the mounting plate 31 and the support plate 32 to each other to form a body and to protect the electrostatic-adsorption inner electrode 25 from plasma or corrosive gas. The insulating layer 33 is preferably made of an insulating material having the same main component as the mounting plate 31 and the support plate 32. For example, when the mounting plate 31 and the support plate 32 are formed of the silicon carbide-aluminum oxide complex sintered body, the insulating layer 33 is preferably made of aluminum oxide ($Al_2O_3$).

"Method of Manufacturing Electrostatic Chuck Device"

A method of manufacturing an electrostatic chuck device according to this embodiment will be described.

Described here is an example in which the mounting plate 31 and the support plate 32 are formed of the silicon carbide-aluminum oxide complex sintered body substantially containing silicon carbide in the range of 1 wt % to 20 wt %.

Silicon carbide powder having an average particle diameter of 0.1 μm or less is preferably used as the raw powder of silicon carbide (SiC).

The reason is that when the average particle size of the silicon carbide (SiC) powder exceeds 0.1 μm, the average particle diameter of the silicon carbide particles in the obtained silicon carbide-aluminum oxide complex sintered body exceeds 0.2 μm. Thus, when exposed to plasma, the electrical field is concentrated on the silicon carbide (SiC) particles, and these particles are easily subject to significant damage. Consequently, the plasma resistance may be reduced, and the electrostatic adsorption force may be reduced after damage has been caused by the plasma.

The powder obtained by a plasma CVD method is preferably used as the silicon carbide (SiC) powder. Specifically, a super fine powder having an average particle diameter of 0.1 μm or less, which is obtained by introducing raw gas of a silane compound or silicon halide and hydrocarbon into plasma in a non-oxidizing atmosphere and carrying out vapor phase reaction while controlling the pressure of the reaction system in the range of $1\times10^5$ Pa (1 atm) to $1.33\times10$ Pa (0.1 Torr), has excellent sintering ability, high purity, and spherical particle shapes, and thus is excellent in dispersibility when this is formed.

On the other hand, aluminum oxide ($Al_2O_3$) powder having an average particle diameter of 1 μm or less is preferably used as the raw powder of aluminum oxide ($Al_2O_3$).

The reason is as follows. In the silicon carbide-aluminum oxide complex sintered body obtained using the aluminum oxide ($Al_2O_3$) powder having an average particle diameter larger than 1 μm, the average particle diameter of the aluminum oxide ($Al_2O_3$) particles in the complex sintered body is greater than 2 μm. Accordingly, the top surface 31a of the mounting plate 31 on which the plate-like sample is mounted can be easily etched by the plasma to form sputtering scars to increase the surface roughness of the top surface 31a, thereby deteriorating the electrostatic adsorption force of the electrostatic chuck device 21.

The aluminum oxide ($Al_2O_3$) powder is not particularly limited, so long as it has an average particle diameter of 1 μm or less and high purity.

Subsequently, the silicon carbide (SiC) powder and the aluminum oxide ($Al_2O_3$) powder are mixed at a ratio to obtain a desired volumetric resistance value.

Then, the mixed powder is shaped into a predetermined shape by the use of a mold and the resultant shaped body is pressurized and baked, for example, by the use of a hot press (HP), thereby obtaining a silicon carbide-aluminum oxide complex sintered body.

The pressurizing force of hot press (HP) conditions is not particularly limited, but is preferably in the range of 5 to 40 MPa when it is intended to obtain the silicon carbide-aluminum oxide complex sintered body. When the pressurizing force is less than 5 MPa, it is not possible to obtain a complex sintered body with a sufficient sintering density. On the other hand, when the pressurizing force is greater than 40 MPa, a jig made of graphite or the like is deformed and worn.

The baking temperature is preferably in the range of 1650° C. to 1850° C. When the baking temperature is less than 1650° C., it is not possible to obtain a sufficiently dense silicon carbide-aluminum oxide complex sintered body. On the other hand, when the baking temperature is greater than 1850° C., decomposition or particle growth of the sintered body may easily occur in the course of baking the sintered body.

The baking atmosphere is preferably an inert gas atmosphere such as argon or nitrogen atmosphere for the purpose of preventing oxidation of silicon carbide.

A power supply terminal insertion hole 36 is mechanically formed at a predetermined position of one sheet of a complex sintered body of two sheets of the resultant silicon carbide-aluminum oxide complex sintered body, which is used as the support plate 32.

In addition, as a coating agent for forming the electrostatic-adsorption inner electrode, a coating agent, which is made into a paste, is prepared by adding a silicon carbide (SiC) powder to an insulating ceramic powder such as aluminum oxide ($Al_2O_3$) at such a ratio that the volumetric resistance under the used temperature of the electrostatic chuck device is from $1.0\times10^{-1}$ Ωcm to $1.0\times10^5$ Ωcm. A conducting layer is formed by applying this coating agent within an area of the supporting plate 32 at which the electrostatic-adsorption inner electrode is to be formed. An insulating layer is formed by applying a coating agent, which is made into a paste and contains an insulating ceramic powder such as aluminum oxide ($Al_2O_3$), to the area outside the area at which this conducting layer is to be formed.

Subsequently, the power supply terminal 27 is inserted into the power supply terminal insertion hole 36 of the support plate 32 with a cylindrical insulator 37 interposed therebetween, the surface of the support plate 32 on which the conductive layer and the insulating layer are formed is superposed on the mounting plate 31, the mounting plate 31 and the support plate 32 are heated and pressurized, for example, at a temperature of 1,600° C. or more, the electrostatic-adsorption inner electrode 25 and the insulating layer 33 as a bonding layer are formed of the conductive layer and the insulating layer, respectively, and then the mounting plate 31 and the support plate 32 are bonded to each other with the electrostatic-adsorption inner electrode 25 and the insulating layer 33 interposed therebetween. Then, the top surface 31a of the mounting plate 31 serving as a mounting surface is polished so that Ra (center-line average roughness) is 0.3 μm or less, thereby manufacturing the electrostatic chuck section 22.

On the other hand, the metal base section 23 in which a circular concave portion 34 is formed in the surface thereof and a flow passage 28 for circulating a cooling medium is formed therein is manufactured using an aluminum (Al) plate. The dielectric plate 24 is manufactured using an aluminum oxide sintered body by shaping and baking aluminum oxide ($Al_2O_3$) powder.

Subsequently, a insulating adhesive bonding agent is applied to the entire inner surface of the concave portion 34 of the metal base section 23, the dielectric plate 24 is adhesively bonded onto the insulating adhesive bonding agent, an insulating adhesive bonding agent is applied onto the metal base section 23 including the dielectric plate 24, and then the electrostatic chuck section 22 is adhesively bonded onto the insulating adhesive bonding agent.

In the adhesive bonding process, the dielectric plate 24 is bonded and fixed to the concave portion 34 of the metal base section 23 with the insulating adhesive bonding layer 35 interposed therebetween. The support plate 32 of the electrostatic chuck section 22 is bonded and fixed to the metal base section 23 and the dielectric plate 24 with the insulating adhesive bonding layer 35 interposed therebetween.

In this way, it is possible to obtain the electrostatic chuck device according to this embodiment.

As explained above, according to the electrostatic chuck device of the present embodiment, the electrostatic-adsorption inner electrode 25 is formed by a complex sintered body that contains insulating ceramics and silicon carbide, and the volumetric resistance thereof is from $1.0\times10^{-1}$ Ωcm to $1.0\times10^{5}$ Ωcm. Thus, even in cases in which the silicon carbide content, the heat treatment temperature, and the baking temperature and the like vary, the volumetric resistance of this electrostatic-adsorption inner electrode can be advantageously maintained within a range of $1.0\times10^{-1}$ Ωcm to $1.0\times10^{5}$ Ωcm.

Therefore, when a high frequency voltage is applied to the metal base section 23, the high frequency current can pass through the electrostatic-adsorption inner electrode 25, the electrical field strength at the surface of the electrostatic chuck section 22 can be made uniform, and making the plasma density uniform can be efficiently attained. As a result, a uniform plasma process can be applied to the plate-like sample.

Hereinafter, the invention will be specifically described with reference to experimental examples, examples, and a comparative example. However, the invention is not limited to these experimental examples and examples.

"Experimental Example 1"

In example 1, a mixed powder was formed by mixing silicon carbide (SiC) powder and aluminum oxide powder such that the added amount of the silicon carbide (SiC) was 6.0 wt %, this mixed powder was pressure molded, and the obtained molded body was baked at 1650° C. for 2 hours in an argon (Ar) atmosphere. The electric furnace that was used for this baking was an experimental furnace in which the temperature distribution within the furnace was ±10° C. The sintered body of experimental example 1 obtained thereby had a diameter of 50 mm and a thickness of 30 mm.

The volumetric resistance of this sintered body was measured at room temperature (25° C.) according to customary methods, and the results are shown in Table 1.

"Experimental Examples 2 to 6"

The sintered bodies of experimental examples 2 to 6 were obtained according to the procedures for obtaining example 1. However, the added amounts of silicon carbide (SiC) powder and the baking temperatures were instead set to the added amounts and baking temperatures that are shown in Table 1, The volume resistivities of these sintered bodies were measured at room temperature (25° C.) according to customary methods, and the results are shown in Table 1.

"Comparative Example 1"

In comparative example 1, a mixed powder was formed by mixing molybdenum carbide ($Mo_2C$) powder and aluminum oxide powder such that the added amount of the molybdenum carbide ($Mo_2C$) powder was 48.2 wt %, this mixed powder was pressure molded, and the obtained molded body was baked at 1750° C. for 2 hours in an argon (Ar) atmosphere. The electric furnace that was used for this baking was identical to the electric furnace that was used for example 1. The sintered body of comparative example 1 obtained thereby had a diameter of 50 mm and a thickness of 30 mm.

The volumetric resistance of this sintered body was measured according to customary methods at room temperature (25° C.), and the results are shown in Table 1.

"Comparative Examples 2 to 4"

The sintered bodies of examples 2 to 4 were obtained according to the procedures for obtaining comparative example 1. However, the added amounts of the molybdenum carbide ($Mo_2C$) powder and the baking temperatures were instead set to the added amounts and baking temperatures that are shown in Table 1.

The volumetric resistances of these sintered bodies were measured at room temperature (25° C.) according to customary methods and the results are shown in Table 1.

TABLE 1

| | Conductive component | | Sintering temperature (° C.) | Volumetric resistance (Ω·cm) |
|---|---|---|---|---|
| | Composition | Added amount (wt. %) | | |
| Example 1 | SiC | 6.0 | 1650 | $8.0 \times 10^3$ |
| Example 2 | SiC | 6.0 | 1700 | $7.0 \times 10^3$ |
| Example 3 | SiC | 6.0 | 1750 | $3.0 \times 10^3$ |
| Example 4 | SiC | 8.0 | 1650 | $2.0 \times 10^2$ |
| Example 5 | SiC | 8.0 | 1700 | $1.8 \times 10^2$ |
| Example 6 | SiC | 8.0 | 1750 | $1.5 \times 10^2$ |
| Comparative Example 1 | $Mo_2C$ | 48.2 | 1750 | $>1.0 \times 10^8$ |
| Comparative Example 2 | $Mo_2C$ | 49.2 | 1700 | $1.0 \times 10^7$ |
| Comparative Example 3 | $Mo_2C$ | 49.2 | 1750 | $1.0 \times 10^0$ |
| Comparative Example 4 | $Mo_2C$ | 50.7 | 1750 | $1.0 \times 10^{-2}$ |

According to Table 1, it can be understood that in comparison to the complex sintered bodies of comparative examples 1 to 4, which included molybdenum carbide ($Mo_2C$) and aluminum oxide, the complex sintered bodies of examples 1 to 6, which included silicon carbide (SiC) and aluminum oxide, had minor variations in the volumetric resistance values even when the composition ratio and the baking temperature were varied.

"Example"

The electrostatic chuck device illustrated in FIG. 1 was prepared based on the manufacturing method described above. However, both the mounting plate 31 and the support plate 32 were instead formed by a silicon carbide-aluminum oxide complex sintered body that had a volumetric resistance of $1.0\times10^{15}$ Ωcm at room temperature (25° C.), a thickness of 0.5 mm, and a diameter of 298 mm. In addition, the electrostatic-adsorption inner electrode 25 was formed of a silicon carbide-aluminum oxide complex sintered body that had a disc shape, contained 8 wt % of silicon carbide (SiC) and the balance being aluminum oxide, had a volumetric resistance of $1.8\times10^2$ Ωcm at room temperature (25° C.), and had a thickness of 25 μm. Furthermore, the dielectric plate 24 was formed by an aluminum oxide sintered body that had a diameter of 239 mm and a thickness of 3.9 mm.

"Evaluation"

Figure 6:
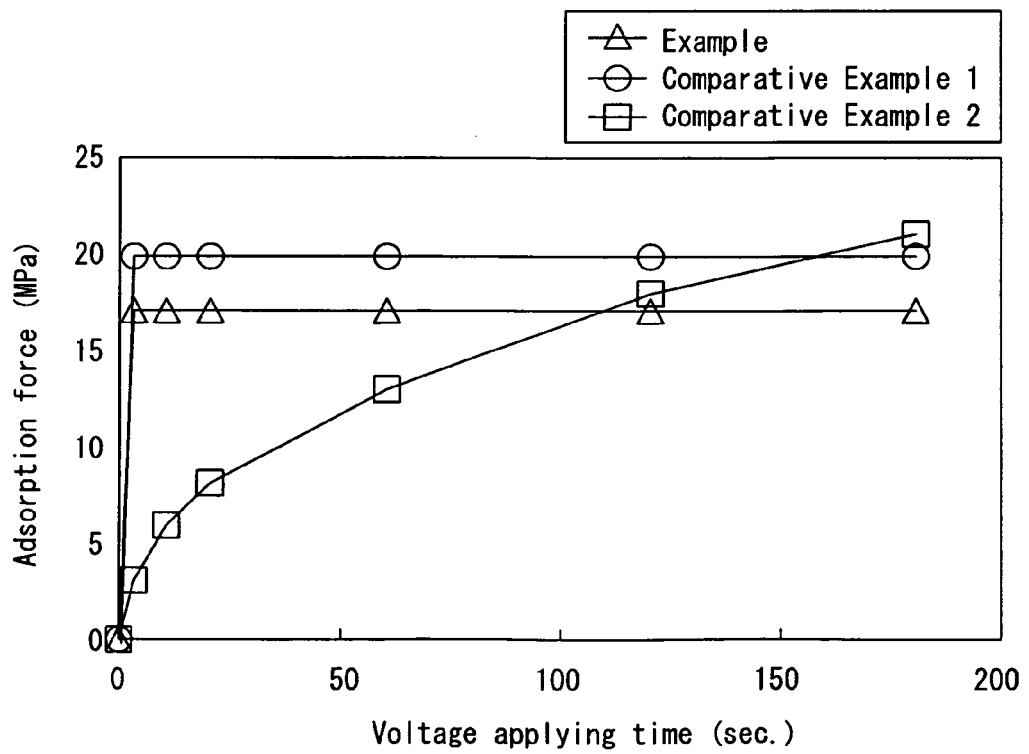
FIG. 6 is a diagram illustrating a measurement result of the variation with time of the electrostatic adsorption force in Examples and Comparative Examples 1 and 2.
Figure 7:
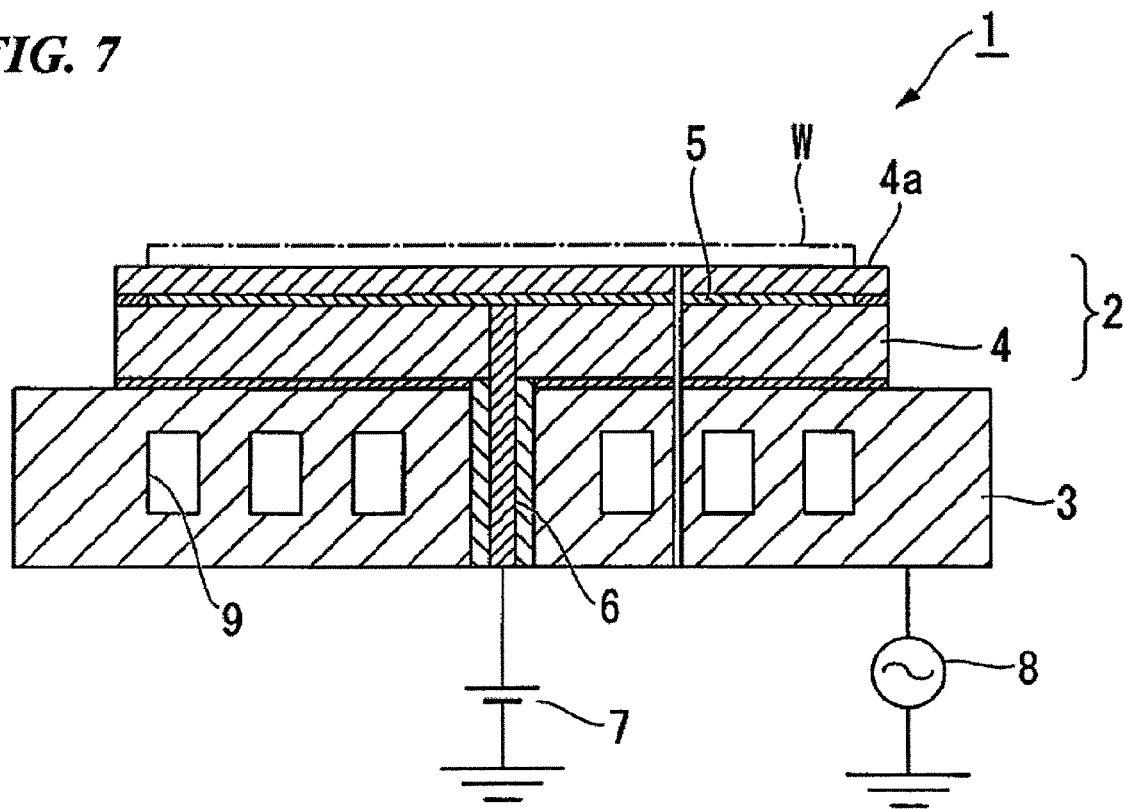
FIG. 7 is a sectional view illustrating an example of a conventional electrostatic chuck.
Figure 8:
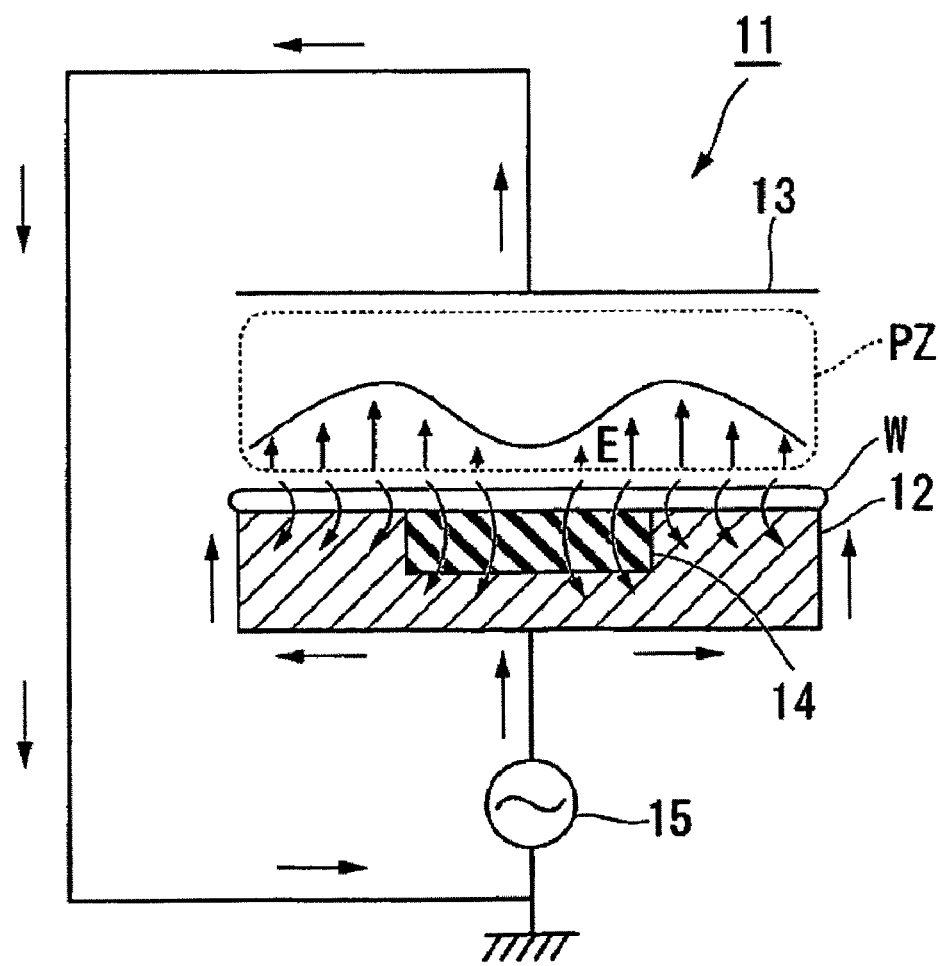
FIG. 8 is a sectional view illustrating an example of a conventional plasma processing apparatus.
Figure 9:
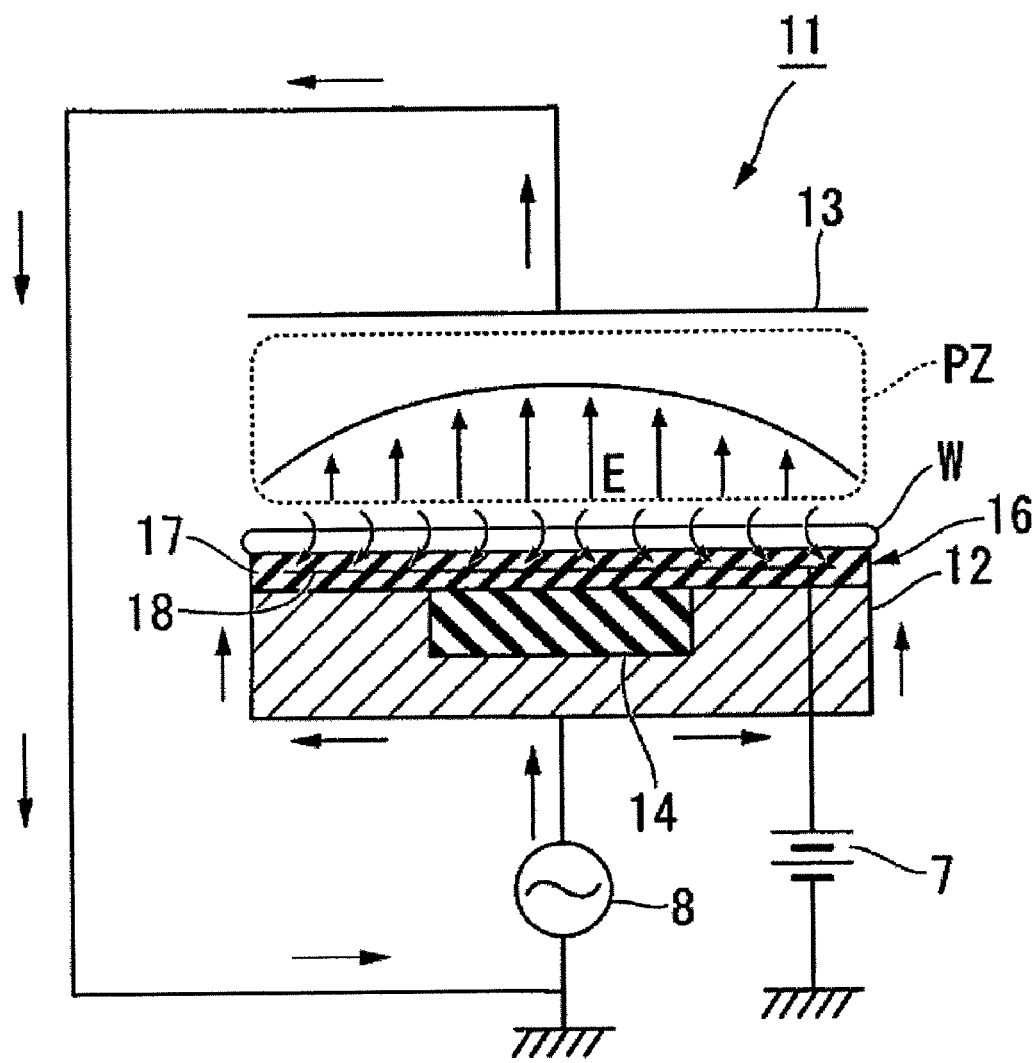
FIG. 9 is a sectional view illustrating an example of a plasma processing apparatus equipped with a conventional electrostatic chuck device.

The plasma uniformity of the electrostatic chuck device of the example was evaluated as follows. In addition, the variation with time (the responsiveness of the electrostatic adsorption force) when a direct current of 2500 V was applied to the power supply terminals was evaluated at room temperature (25° C.). The variation with time of the electrostatic adsorption force is shown in FIG. 6.

"Method for Evaluating the Plasma Uniformity"

The electrostatic chuck device of the example was mounted in a plasma etching apparatus, a wafer with a diameter of 300 mm (12 inches) and on which a resist film had been formed was used as the plate-like sample, this wafer was mounted on the mounting surface of the electrostatic chuck device, plasma was generated while the wafer was fixed by electrostatic adsorption resulting from the application of a direct current of 2500 V, and an ashing process was performed on the resist film. The processing chamber was pressurized using $O_2$ gas (supplied at 100 sccm) at 0.7 Pa (5 mTorr), and the high-frequency electric power for generating plasma had a frequency of 100 MHz and a voltage of 2 kW. In addition, He gas with a predetermined pressure (15 Torr) was made to flow in the gap between the mounting plate 31 of the electrostatic chuck device and the wafer through the cooling gas inlet 38, and cooling water at 20° C. was made to flow in the flow passage 28 of the metal base section 23.

Subsequently, the thickness of the resist film from the center portion to the peripheral portion of the wafer was measured and the etched amount was calculated.

"Comparative Example 1"

The electrostatic chuck device of comparative example 1 was manufactured similarly to the examples. However, the electrostatic-adsorption inner electrode 25 was instead formed by a molybdenum carbide-aluminum oxide complex sintered body that contained 35 vol % of molybdenum carbide ($Mo_2C$) and the balance being aluminum oxide, had a volumetric resistance of $5.0 \times 10^{-2}$ Ωcm at room temperature (25° C.), and had a thickness of 10 μm.

The plasma uniformity and variation with time of the electrostatic adsorption force (the responsiveness of the electrostatic adsorption) of the electrostatic chuck device of this comparative example 1 were evaluated according to the procedures of the example. The variation with time of the electrostatic adsorption is shown in FIG. 6.

"Comparative Example 2"

The electrostatic chuck device of the comparative example 2 was obtained similarly to the example. However, the electrostatic-absorption inner electrode 25 was instead formed by a silicon carbide-aluminum oxide complex sintered body that contained 3 wt % of silicon carbide (SiC) and the balance being aluminum oxide, had a volumetric resistance at room temperature (25° C.) was $5.0 \times 10^8$ Ωcm, and had a thickness of 20 μm.

The plasma uniformity of the electrostatic chuck device and the variation with time (responsiveness of the electrostatic adsorption) of this comparative example 2 were evaluated according to the procedures of the example. The variation with time of the electrostatic adsorption force is shown in FIG. 6.

According to the results of these evaluations, it was understood that in the electrostatic chuck device of the example, the plasma uniformity was superior because the etched amounts were substantially identical at the center portion and the peripheral portion of the wafer, the electrostatic adsorption force was also saturated immediately after the application of the voltage, and the electrostatic adsorption responsiveness were advantageous.

In contrast, in the electrostatic chuck device of comparative example 1, it was understood that although the electrostatic adsorption responsiveness was advantageous, the plasma uniformity was inferior because the etched amount was large at the center portion and small at the peripheral portion of the wafer.

In addition, in the electrostatic chuck device of comparative example 2, although the plasma uniformity was found to be superior because the etched amounts at the center portion and the peripheral portion of the wafer were substantially identical, the responsiveness of the electrostatic adsorption was inferior and the electrostatic adsorption force was not saturated.

The invention claimed is:

1. An electrostatic chuck device comprising:
    an electrostatic chuck section that comprises a substrate having a first surface and a second surface opposite the first surface, the first surface being a mounting surface on which a plate-like sample is mounted and has an electrostatic-adsorption inner electrode built therein, and a power supply terminal that applies a direct current voltage to the electrostatic-adsorption inner electrode; and
    a metal base that is fixed so as to be integrated with the second surface of the substrate of the electrostatic chuck section;
    wherein the electrostatic-adsorption inner electrode comprises a complex sintered body containing insulating ceramics and silicon carbide, and the volumetric resistance thereof is equal to or greater than $1.0 \times 10^2$ Ωcm and less than $1.0 \times 10^4$ Ωcm.

2. An electrostatic chuck device according to claim 1, wherein the complex sintered body contains silicon carbide from 5 wt % to 20 wt %.

3. An electrostatic chuck device according to claim 1, wherein the complex sintered body contains one or more species selected from a group consisting of metals, carbon, and conducting ceramics at a total of 30 vol % or less.

4. An electrostatic chuck device according to claim 1, further comprising a dielectric material positioned at least partially between the metal base and the second surface of the electrostatic chuck section.

5. An electrostatic chuck device according to claim 4, further comprising a substantially non-conductive adhesive material at least positioned between the dielectric material and the metal base.

6. An electrostatic chuck device according to claim 4 wherein the dielectric material extends over substantially the entire area between the metal base and the second surface of the electrostatic chuck section.

7. An electrostatic chuck device according to claim 6 wherein the dielectric material is at least partially embedded in the metal base.

8. An electrostatic chuck device comprising:
    an electrostatic chuck section that comprises a substrate having a first surface and a second surface opposite the first surface, the first surface being a mounting surface on which a plate-like sample is mounted and has an electrostatic-adsorption inner electrode built therein, and a power supply terminal that applies a direct current voltage to the electrostatic-adsorption inner electrode;
    a metal base that is fixed so as to be integrated with the second surface of the substrate of the electrostatic chuck section; and
    a dielectric material positioned at least partially between the metal base and second surface of the electrostatic chuck section;
    wherein the electrostatic-adsorption inner electrode comprises a complex sintered body containing insulating ceramics and silicon carbide, and the volumetric resistance thereof is equal to or greater than $1.0 \times 10^2$ Ωcm and less than $1.0 \times 10^4$ Ωcm.

9. An electrostatic chuck device according to claim 8, further comprising a substantially non-conductive adhesive material at least positioned between the dielectric material and the metal base.

10. An electrostatic chuck device according to claim 8 wherein the dielectric material extends over substantially the entire area between the metal base and the second surface of the electrostatic chuck section.

11. An electrostatic chuck device according to claim 10 wherein the dielectric material is at least partially embedded in the metal base.

* * * * *

UNITED STATES PATENT AND TRADEMARK OFFICE
CERTIFICATE OF CORRECTION

PATENT NO. : 8,264,813 B2
APPLICATION NO. : 12/310094
DATED : September 11, 2012
INVENTOR(S) : Inazumachi et al.

Page 1 of 1

It is certified that error appears in the above-identified patent and that said Letters Patent is hereby corrected as shown below:

On the Title page, Item (75) Inventors should read:

Mamoru Kosakai, "Chiyoda-ku" should read --Narashino-shi--
Yukio Miura, "Chiyoda-ku" should read --Funabashi-shi--
Keigo Maki, "Chiyoda-ku" should read --Ichikawa-shi--

Signed and Sealed this
Fourth Day of June, 2013

Teresa Stanek Rea
*Acting Director of the United States Patent and Trademark Office*